United States Patent
Ziauddin et al.

(10) Patent No.: US 7,221,296 B2
(45) Date of Patent: May 22, 2007

(54) METHOD AND SYSTEM FOR FAST CONTEXT BASED ADAPTIVE BINARY ARITHMETIC CODING

(75) Inventors: Syed Muhammad Ziauddin, Islamabad (PK); Mohammad Ayub Khan, Santa Clara, CA (US)

(73) Assignee: Streaming Networks (Pvt.) Ltd., Islamabad (PK)

( * ) Notice: Subject to any disclaimer, the term of this patent is extended or adjusted under 35 U.S.C. 154(b) by 0 days.

(21) Appl. No.: 11/209,996

(22) Filed: Aug. 22, 2005

(65) Prior Publication Data
US 2007/0040711 A1    Feb. 22, 2007

(51) Int. Cl.
*H03M 7/00* (2006.01)
(52) U.S. Cl. ...................... 341/107; 382/239
(58) Field of Classification Search ............... 341/50, 341/107, 63, 65; 382/239, 246
See application file for complete search history.

(56) References Cited

U.S. PATENT DOCUMENTS 5,654,702 A * 8/1997 Ran .................. 341/51
6,940,429 B2 * 9/2005 Sankaran ................ 341/65
2006/0023795 A1 * 2/2006 Kim ....................... 375/242
2006/0028359 A1 * 2/2006 Kim et al. ................ 341/50

* cited by examiner

*Primary Examiner*—Peguy JeanPierre
(74) *Attorney, Agent, or Firm*—McDermott, Will & Emery

(57) ABSTRACT

A method and processor for providing context-based adaptive binary arithmetic CABAC coding. Binarization is performed on one or more syntax elements to obtain a binary sequence. Data bits of the said binary sequence are provided to an arithmetic encoding unit in bulk. Binarization is performed on one or more syntax elements to generate exp Golomb code by converting mapped syntax-element values to corresponding floating point type values. Re-normalization of CABAC encoding is performed by restructuring the re-normalization into two processing units including an arithmetic encoding unit and a bit writing unit. The bit writing unit is configured to format signal bits into a multiple-bit sequence, and write multiple bits simultaneously during an execution of a bit writing loop.

16 Claims, 11 Drawing Sheets

- Lb = length of binarized syntax element
- bitIdx = index of bit in binary sequence [0, Lb)
- bit_value[bitIdx] = bit value at bit index bitIdx
- ctxIdx[bitIdx] = context table index for bit at bit index bitIdx

METHOD AND SYSTEM FOR FAST CONTEXT BASED ADAPTIVE BINARY ARITHMETIC CODING

BACKGROUND

1. Field

The present invention generally relates to entropy encoding of video data. The present invention can be used, amongst other things, to increase the speed of implementation of context-based adaptive binary arithmetic coding (CABAC) in H.264/AVC video encoders.

2. Background

The increasing demand to incorporate video data in transmission and storage systems and the desire to improve the quality of video in such systems have prompted rapid advancement in video compression techniques. During the last decade, many ISO/ITU standards on video compression (e.g., MNPEG.1, MPEG2, MPEG.4, H.263, and H.2.64) have evolved. These standards exploit the spatio-temporal correlation in the video data and utilize entropy coding techniques to achieve high compression ratios. Entropy coding is a loss-less compression process that is based on the statistical properties of data. Entropy coders assign codes to symbols so as to match code lengths with the probabilities of occurrence of the symbols. The basic idea is to express the most frequently occurring symbols with the least number of bits.

Some of the commonly used entropy coding techniques used in video compression include Golomb coding, Hauffman coding and Arithmetic coding. Arithmetic coding combined with context-adaptive modeling techniques has shown better compression results compared to the other forms of entropy coding. Owing to its higher coding efficiency, several video coding standards, including the latest in the line H.264/AVC video standard, support Arithmetic coding as a higher compression mode. The H.264/AVC video standard supports a base-line entropy coding method known as Context Adaptive Variable Length Coding (CAVLC) and a high efficiency entropy coding method known as Context-based Adaptive Binary Arithmetic Coding (CABAC). CABAC offers a different compression-complexity tradeoff at a higher coding efficiency and higher complexity level compared to the base-line CAVLC. Some important properties of CABAC include the binary nature of symbols, adaptive context modeling, and a table driven arithmetic coding engine.

Despite its higher coding efficiency, one main disadvantage of Arithmetic coding lies in its high computational cost. This issue relating to high computational cost applies to CABAC as well. The CABAC encoding algorithm includes three basic steps: binarization, context modeling, and binary arithmetic encoding. In the binarization step, a non-binary syntax element is mapped to a unique binary sequence. In the H.264/AVC standard, the binarization schemes are either manually chosen or are obtained by a combination of four elementary code types. The four elementary code types include unary codes, truncated unary codes, kth order Exp-Golomb codes and fixed length codes. In conventional systems, each bit of the binary sequence is passed through a context modeling stage, where a context-dependent probability model is selected. The bit along with its model is then passed on to the arithmetic encoding engine, where coding of the bit takes place and the model gets updated.

Although the binary nature of CABAC reduces its model-update overhead, its inherent sequential nature and extensive memory accesses make its computational requirements high. The increased computational complexity hampers the adoption of CABAC in solutions running on low powered DSPs (digital signal processors) and other processing devices. Keeping in view the fact that H.264/AVC is expected to supercede all previous video coding standards, it may be appreciated that it would be desirable to develop methods that reduce the implementation complexity of the CABAC algorithm.

SUMMARY OF THE INVENTION

The present invention relates to methods that may be used to make the implementation of CABAC on DSPs and other processing devices significantly faster. The present invention increases instruction level parallelism in the CABAC encoding process, reduces function call overhead, increases the efficiency of bit stream writing, and provides efficient methods of binarization.

In one aspect, the present invention increases the decoupling of the binarization and context modeling stages from the arithmetic coding stage. Although, the extent to which this decoupling is possible can be fixed arbitrarily, the present invention uses the data-register size of a DSP or any other processing device as the basis for decoupling these stages. Thus, for a 32-bit machine, a set comprising one or multiple syntax elements may be binarized to form a binary sequence up to thirty-two (32) bits in length, and context-model indexes for the entire binary sequence may be selected. It may be noted that the scope of the present invention is not limited by the maximum length of the binarized data. The binarized sequence along with its length and list of context indexes is passed onto the arithmetic encoding engine. Presenting the arithmetic coding engine with binarized data in bulk significantly reduces the overhead due to function calls. This technique also reduces the overall code size since one generic routine can handle the binarized data of all the syntax elements.

In another aspect, the present invention provides a CABAC arithmetic encoding engine format that exploits the available parallelism in the encoding process in an effective fashion and reduces data writing overhead. The encoding engine format separates the arithmetic encoding part from the data writing part without requiring any intermediate storage and also reduces branching overhead. These features increase the instruction level parallelism of the CABAC encoding process, which is particularly advantageous for use in very long instruction word (VLIW) DSPs and media processors. In one embodiment, the CABAC encoding engine format, as provided by the present invention, operates on a binarized sequence and writes multiple output bits per iteration into the compressed stream. Thus, the number of times the bit writing loop is executed is reduced and the throughput of the arithmetic encoding engine is increased.

In yet another aspect, the present invention discloses efficient methods for implementing order 0 and order 3 exponential Golomb code suffixes needed in the binarization schemes of the residual data and motion vector data, respectively. In one embodiment, the binarization methods as disclosed by the present invention do not require pre-computed tables, thereby bringing the bypass-encoding mode of CABAC into the same decoupled framework as the regular encoding mode of the present invention.

It is understood that other embodiments of the present invention will become readily apparent to those skilled in the art from the following detailed description, wherein various embodiments of the invention are shown and described by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

Aspects of the present invention are illustrated by way of example, and not by way of limitation, in the accompanying drawings, wherein.

DETAILED DESCRIPTION

The detailed description set forth below in connection with the appended drawings is intended as a description of various embodiments of the present invention and is not intended to represent the only embodiments in which the present invention may be practiced. The description includes specific details for the purpose of providing an understanding of the present invention.

Figure 1:
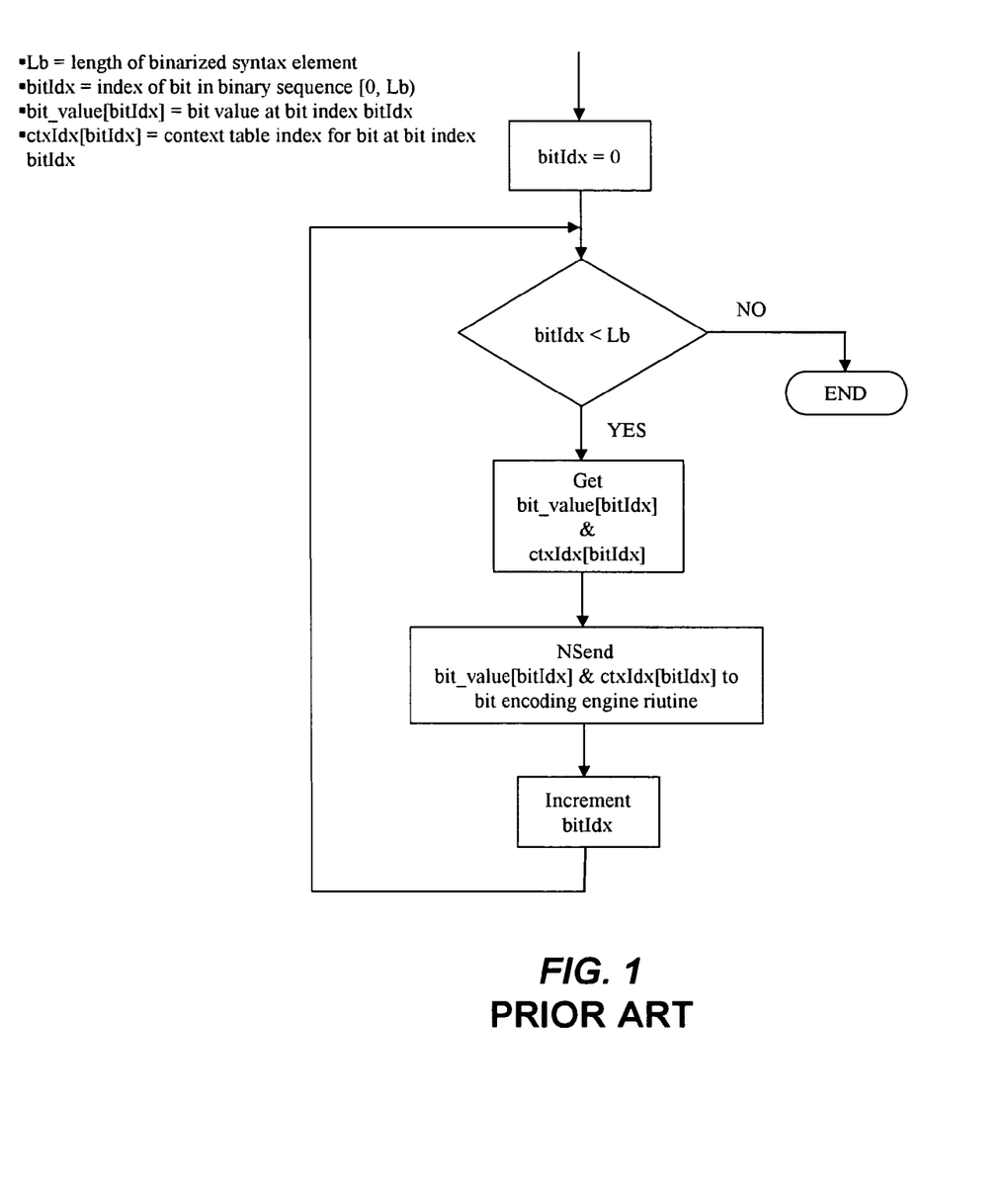
FIG. 1 is a flow diagram of the sequential flow of the CABAC encoding process in the H.264 standard software.

One or more embodiments of the present invention will now be described. FIG. 1 depicts in simplified form the flow of the CABAC encoding process of a syntax element in H.264 standard software. In this case, the binarization, context index selection, and arithmetic encoding stages are intertwined on a bit-by-bit basis. This close coupling greatly increases procedure calls overhead.

Figure 2:
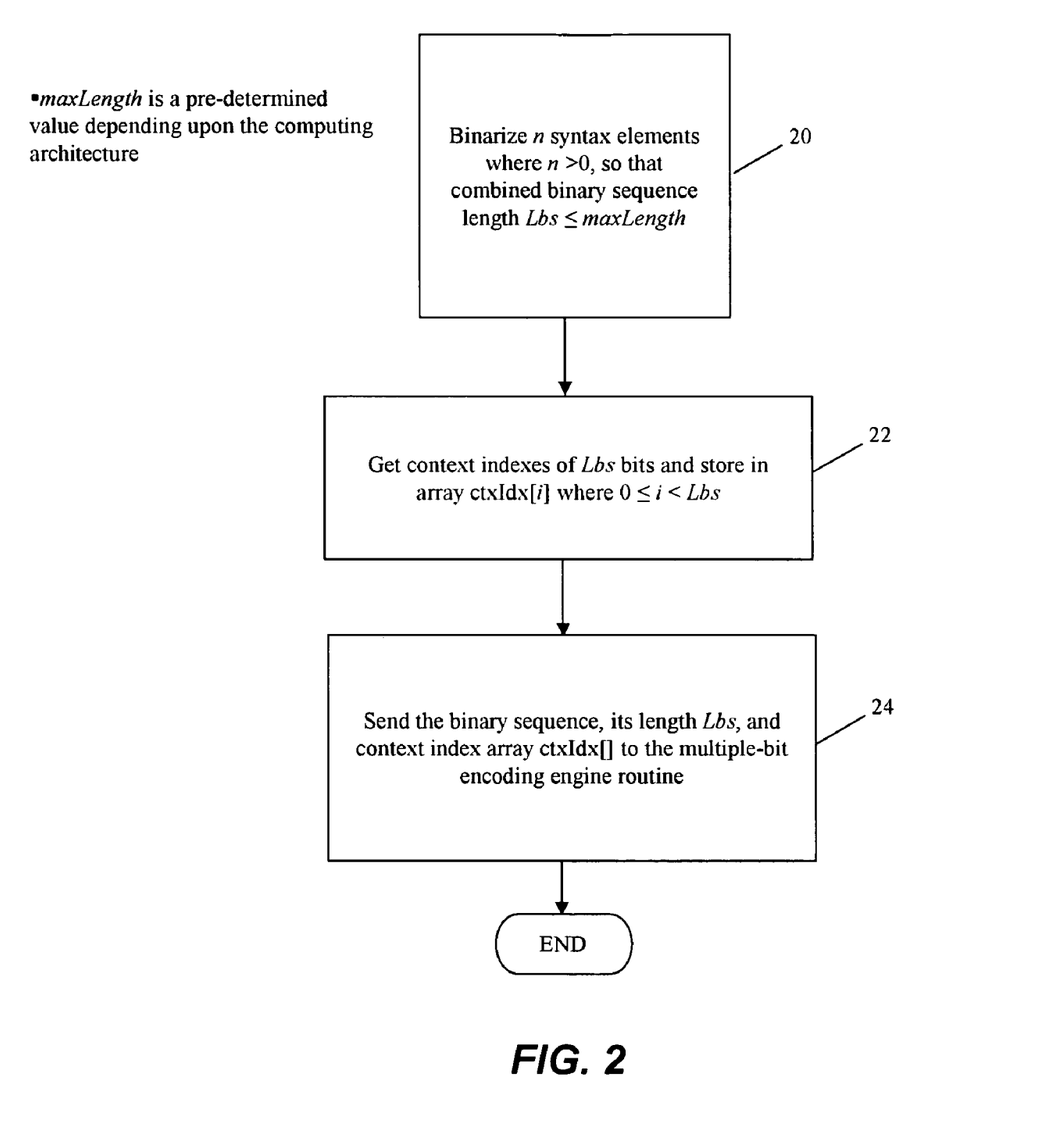
FIG. 2 is a flow diagram of the decoupled CABAC encoding process according to one embodiment of the present invention.

FIG. 2 is a flow diagram of the CABAC encoding process according to one embodiment of the present invention. Here, the binarization and context index selection stages (20, 22) are increasingly decoupled from the encoding stage (24) on the basis of one or more syntax elements. Once the syntax element(s) are binarized, the entire binary data is encoded in one call of a multiple-bit encoding engine.

To further illustrate the concept of decoupling, three syntax elements of H.264/AVC may be considered. A one-bit syntax element coded_block_flag and a binary-valued significance-map are used in H.264/AVC to indicate the occurrence and the location of non-zero transform coefficients in a given block. The significance-map comprises an interweaved sequence of binary syntax elements significant_coefficient_flag and last_significant_coefficient_flag. The three syntax elements have different ranges of context indexes in the CABAC context model table. For a coded block, the cumulative length of the binarized sequence of these three (3) syntax elements may lie anywhere between three (3) and thirty-one (31). If the allowed maximum length of the binary sequence that can be handled at a time (maxLength) is thirty-two (32), then these three (3) syntax elements may be encoded in one iteration of the flow diagram as shown in FIG. 2, with n=3, and 3<Lbs<31. As a result, the procedure call overhead is greatly reduced compared to the prior art case of FIG. 1, where the single bit-encoding engine routine will have to be called multiple times ranging from three (3) to thirty-one (31) for the three (3) syntax-elements from different calling functions.

Figure 3:
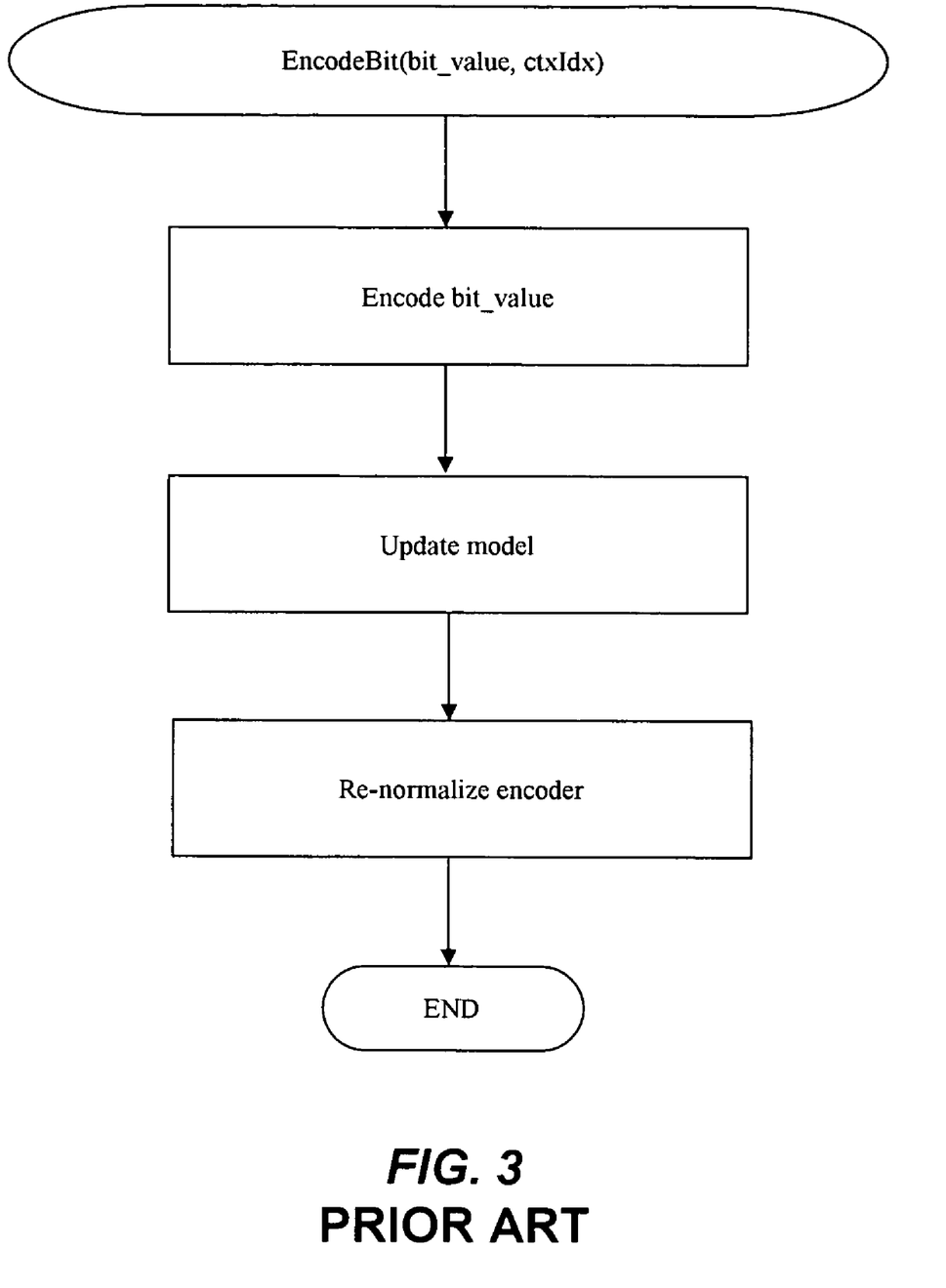
FIG. 3 is a flow diagram of the single-bit sequential CABAC regular mode encoding engine of the H.264 standard software.

FIG. 3 is a flow diagram illustrating the single-bit CABAC regular mode encoding engine of the H.264 standard software. This routine is called every time a single bit is encoded. The re-normalization part of the EncodeBit routine of FIG. 3 is typically time-consuming and intensive, due to its multiple decisions and sequential nature.

Figure 4:
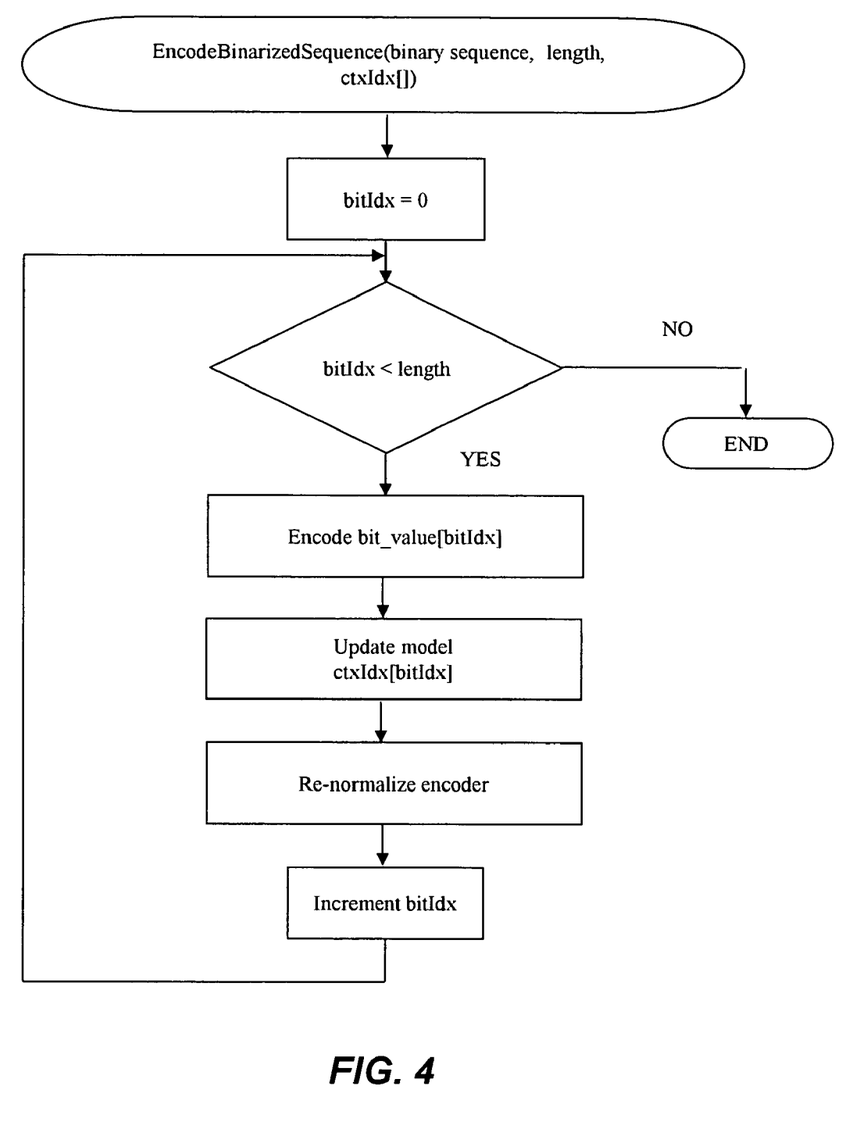
FIG. 4 is a flow diagram depicting the multiple-bit CABAC regular mode encoding engine according to one embodiment of the present invention.

FIG. 4 is a flow diagram depicting the multiple-bit CABAC regular mode encoding engine according to one embodiment of the present invention. The inputs to this routine include a binarized sequence of one or more syntax elements, the length of the binary sequence, and the list of context indexes/context index increments of the entire sequence. Procedure call overhead is greatly reduced in this case. As will be further illustrated below, the re-normalization part of the CABAC encoding engine of FIG. 4 is structurally efficient and exploits the inherent parallelism of the CABAC encoding process.

Figure 5:
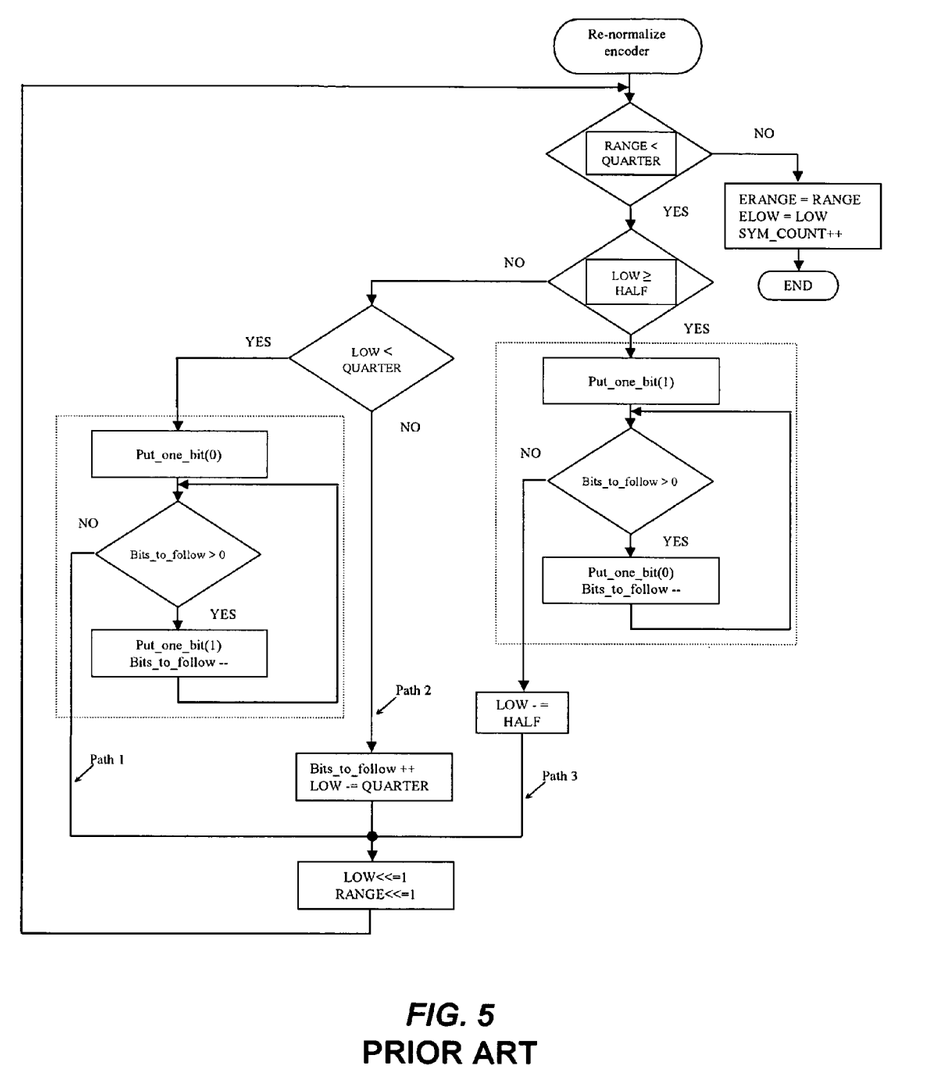
FIG. 5 is a flow diagram showing the re-normalization part of the CABAC regular mode encoding engine as given in the H.264 standard.

FIG. 5 is a flow diagram showing the re-normalization part of the CABAC regular mode encoding engine as given in the H.264 standard. The sequential nature of this scheme, its multiple paths (shown as Path1, Path2, and Path3) that need to be traversed during iterations, and the tight coupling that exists between the encoding decisions and the bit-writing loops (shown enclosed in dotted blocks) greatly reduce the efficiency of implementation. These factors hide the inherent instruction level parallelism of the encoding process, which adversely affects implementation on processing devices, especially the VLIW processors. Another factor that lowers the efficiency of implementation is the bit-by-bit sequential writing loop process (shown enclosed in dotted blocks). These inner most loops are executed extensively and form a major bottle-neck in CABAC encoding. The present invention targets, amongst other things, all these problems and presents an alternative efficient CABAC encoder re-normalization format.

Figure 6:
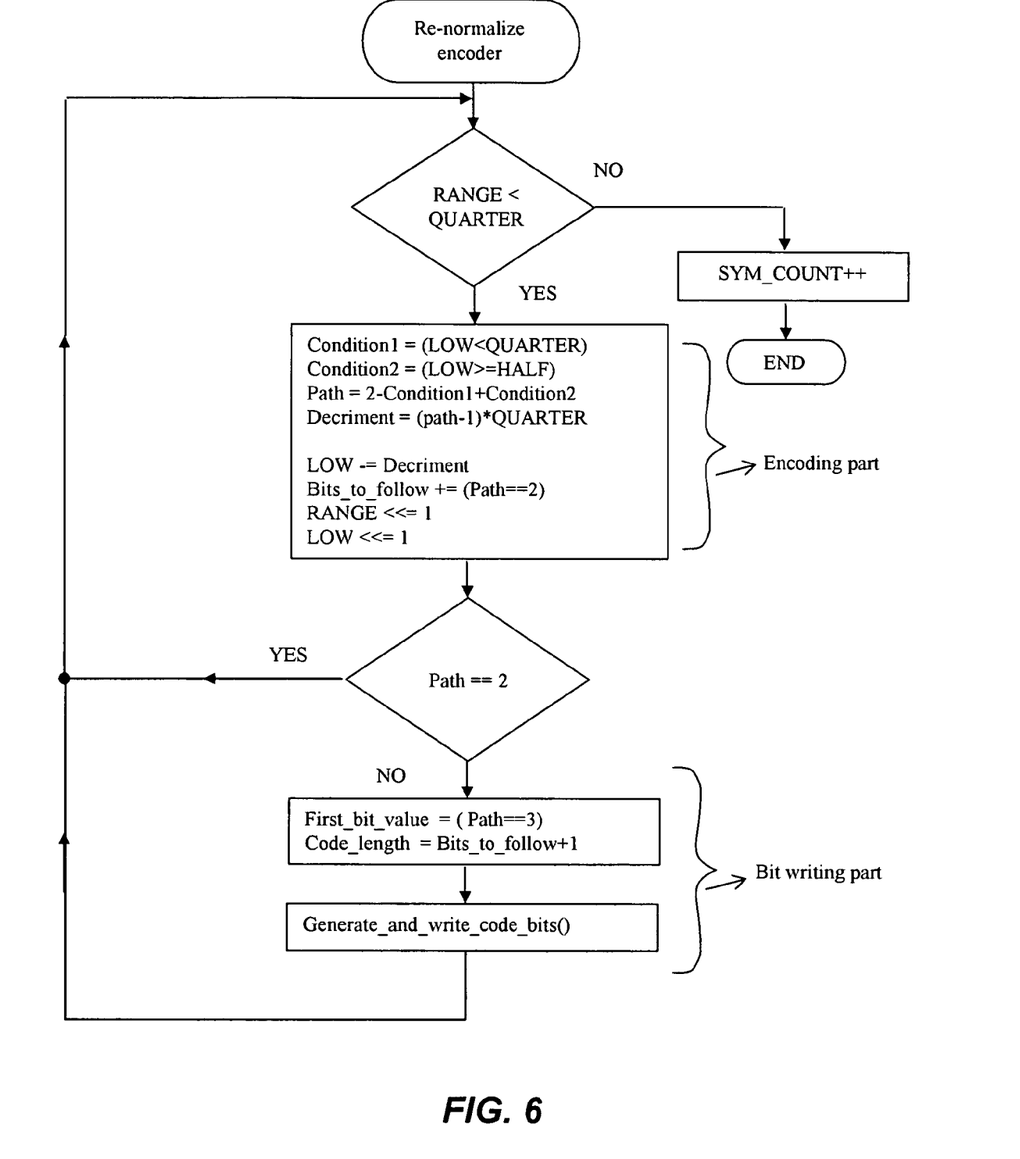
FIG. 6 is a flow diagram showing the re-normalization part of the CABAC regular mode encoding engine according to one embodiment of the present invention.

FIG. 6 is a flow diagram showing the re-normalization part of the CABAC regular mode encoding engine according to one embodiment of the present invention. This format reduces the amount of branching in the code and exposes the hidden inherent parallelism in the CABAC encoding process. The overall processing is conveniently divided into two parts, the encoding part and the bit-writing part. By creating two separate processing parts, instruction level parallelism is increased, thereby improving the performance of processing devices. For example, VLIW processors can benefit from the encoding format of FIG. 6, since compilers will have ample opportunity to optimize and schedule the code and reduce the number of decision trees.

Figure 7:
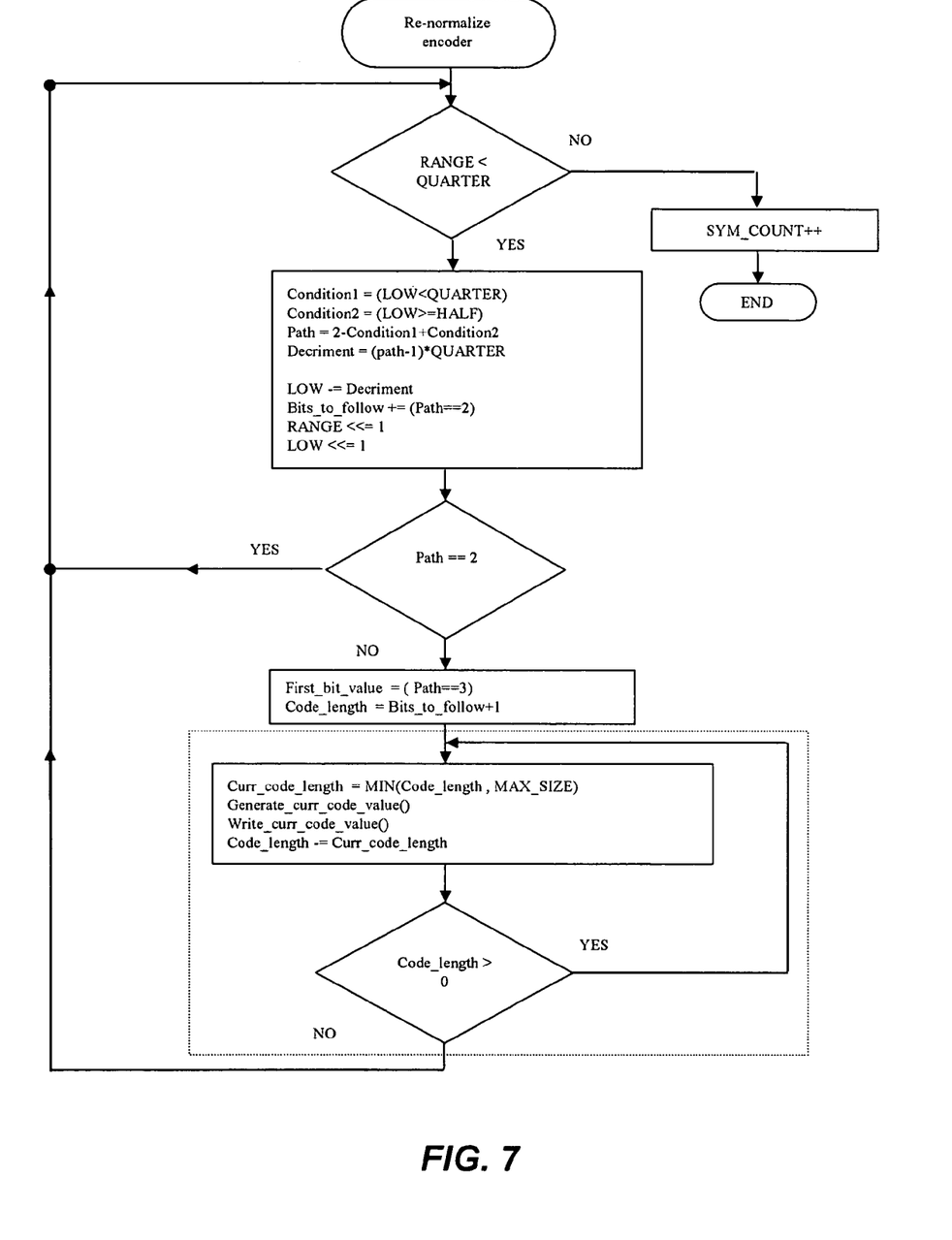
FIG. 7 is a flow diagram showing the re-normalization part of the CABAC regular encoding engine according to one embodiment of the present invention, with the bit writing part expanded.

FIG. 7 is a block diagram showing the re-normalization part of the CABAC regular mode encoding engine according to one embodiment of the present invention, with the bit-writing part expanded. One important feature of the CABAC encoding format of the present invention is the simultaneous multiple-bit writing process, shown enclosed in the dotted block in FIG. 7. Depending upon the CABAC encoder state, at a certain time instance, a first-bit combined with a sequence of subsequent bits may be available for writing to the compressed stream. In the prior case shown in FIG. 5, these bits were written sequentially one after the other, thereby causing the bit writing efficiency to drop and the inner most writing loops to become bottlenecks in the overall process.

The bit-by-bit sequential bit writing process of FIG. 5 is replaced by the simultaneous multiple-bit writing process of FIG. 7. Since the number of bits that are available for writing at a certain time instance is known and the binary value of the first bit and those of the following bits are also known, the entire code sequence that is to be written may be generated in advance. A simultaneous multiple-bit writing process is then executed to write the entire code sequence in one step. If the length of the code word to be written is greater than the maximum code size (MAX_SIZE) that can be written simultaneously, the code sequence is broken down into chunks of MAX_SIZE and the entire sequence is written in minimum iterations. The value of MAX_SIZE may vary from one implementation to another and may depend upon the underlying architecture of the computing device.

It should be noted that, in one embodiment, the present invention simultaneously generates and writes multiple code bits without requiring any intermediate storage stage.

Figure 8:
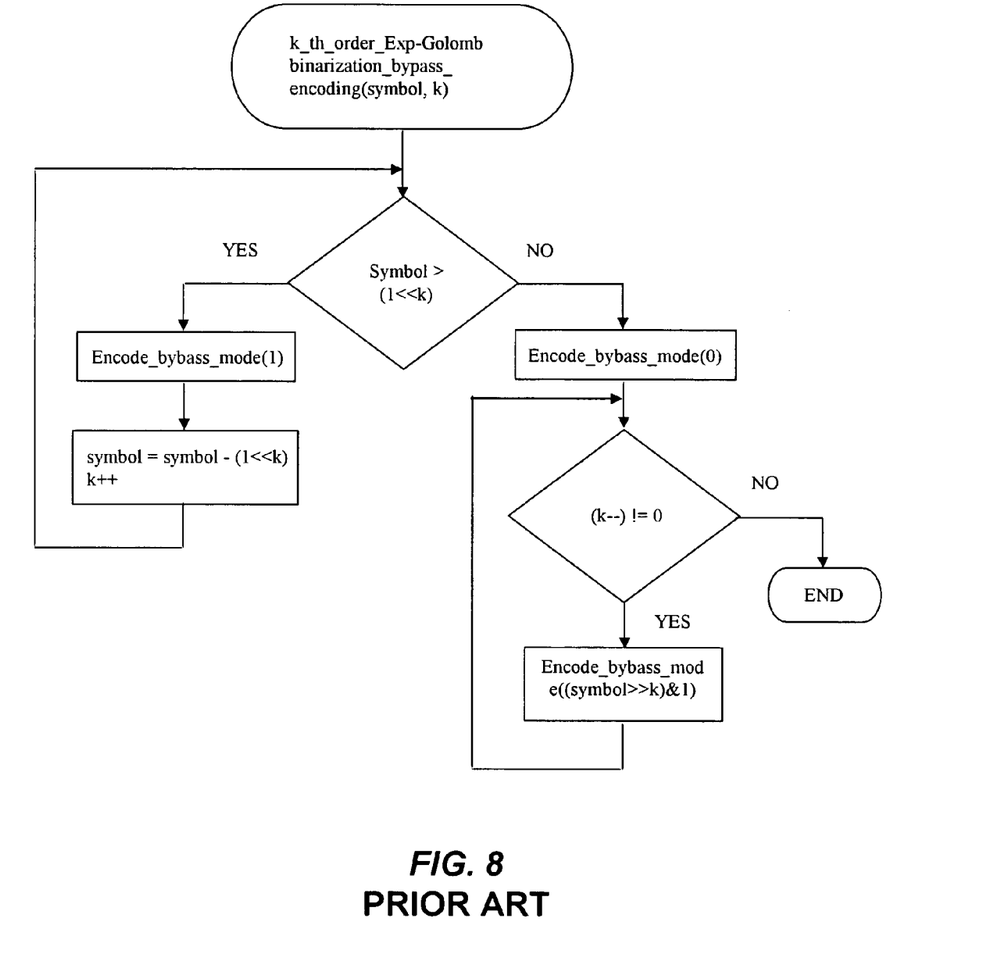
FIG. 8 is a flow diagram showing the tight coupling of kth order exponential Golomb binarization with the CABAC bypass mode encoding engine as given in the H.264 standard.

FIG. 8 is a flow diagram showing the tight coupling of kth order exponential Golomb binarization with the CABAC bypass mode encoding engine as given in the H.264 standard. The CABAC bypass mode is used for equi-probable symbols that include the suffixes of binarized codes of the residual data and those of the motion vector data. These suffixes are binarized by order-k exp Golomb codes, where k is zero (0) for the residual data and three (3) for the motion vector difference data. The overall binary sequence of residual data and motion vector vector data is formed by concatenating truncated unary code prefixes and order-k exp Golomb code suffixes. The prefixes are coded in the regular mode, while the order-k exp Golomb code suffixes along with the sign bit of each syntax element are encoded in the bypass mode. The tight coupling between the binarization process and bypass encoding as shown in FIG. 8 makes the process sequential and increases procedure call overhead.

In order to bring the bypass encoding mode of CABAC into the same decoupled framework as developed for the regular encoding mode of the present invention, efficient binarization schemes for the order-k exp Golomb code suffixes are provided.

Figure 9:
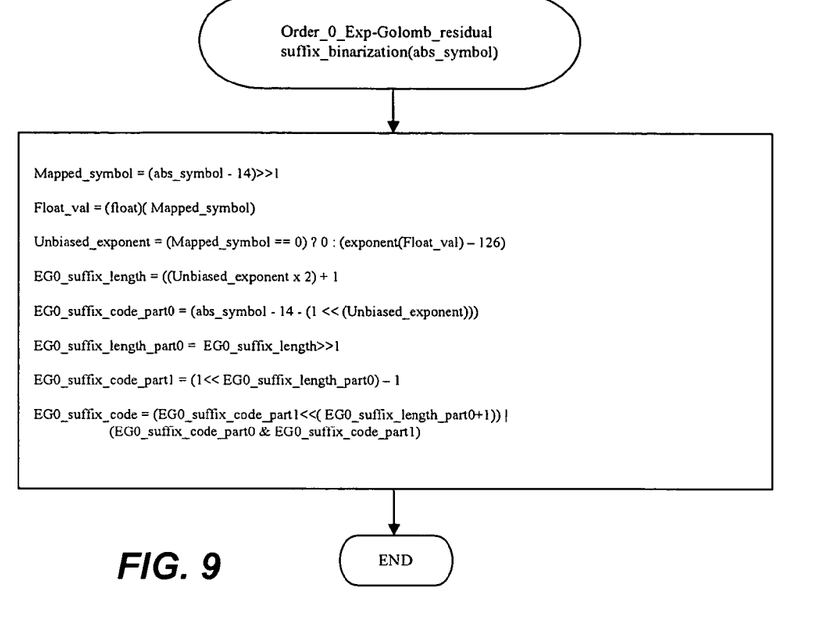
FIG. 9 is a pseudo code showing a technique for order-0 exp Golomb code suffix binarization according to one embodiment of the present invention.
Figure 10:
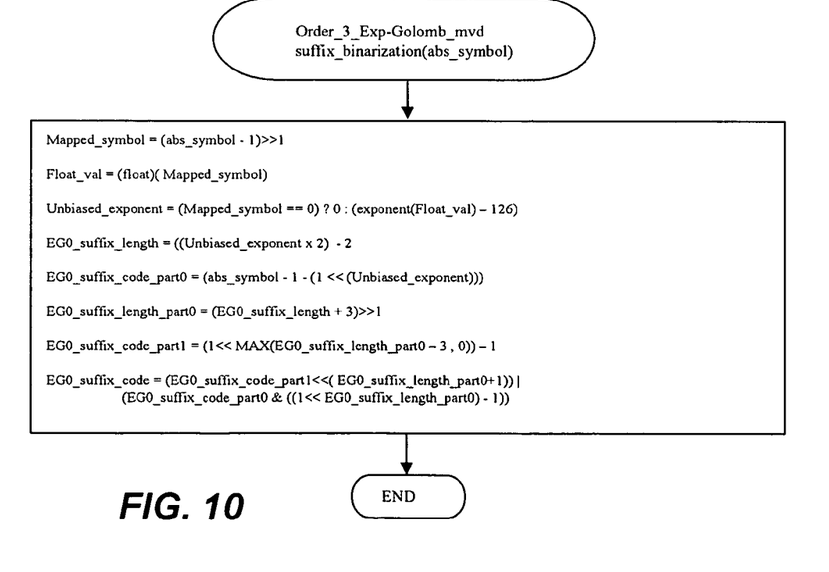
FIG. 10 is a pseudo code showing a technique for order-3 exp Golomb code suffix binarization according to one embodiment of the present invention.

FIG. 9 and FIG. 10 illustrate efficient techniques for order-0 and order-3 exp Golomb code binarization for the residual data and motion vector data, respectively. The main idea behind these schemes is to compute the length and code value of order-0 and order-3 exp Golomb code binarization of a syntax element by using a single conversion of a mapping of the syntax element to a floating point type variable. When such a conversion from integer type to a floating point type occurs, the value of the integer gets divided into two parts, an exponent part and a fraction part. According to the IEEE standard for single precision floating point format, a number includes a most significant sign bit, followed by an eight-bit exponent, followed by a twenty-three (23) bit fraction part. Moreover, according to the IEEE standard, the exponent is biased by a certain value and the actual exponent is determined by subtracting this value from the biased exponent. The un-biased exponent gives the description of the number in powers of two (2) and provides a means to directly determine the length and value of exp Golomb code suffix as shown in FIG. 9 and FIG. 10. The pseudo codes of FIG. 9 and FIG. 10 contain mapping of the input syntax elements according to the CABAC binarization process.

It should be noted that although the schemes in FIG. 9 and FIG. 10 pertain to single precision float point conversion, multiple precision conversions can also be used for binarization purpose and thus fall within the scope of the present invention.

Figure 11:
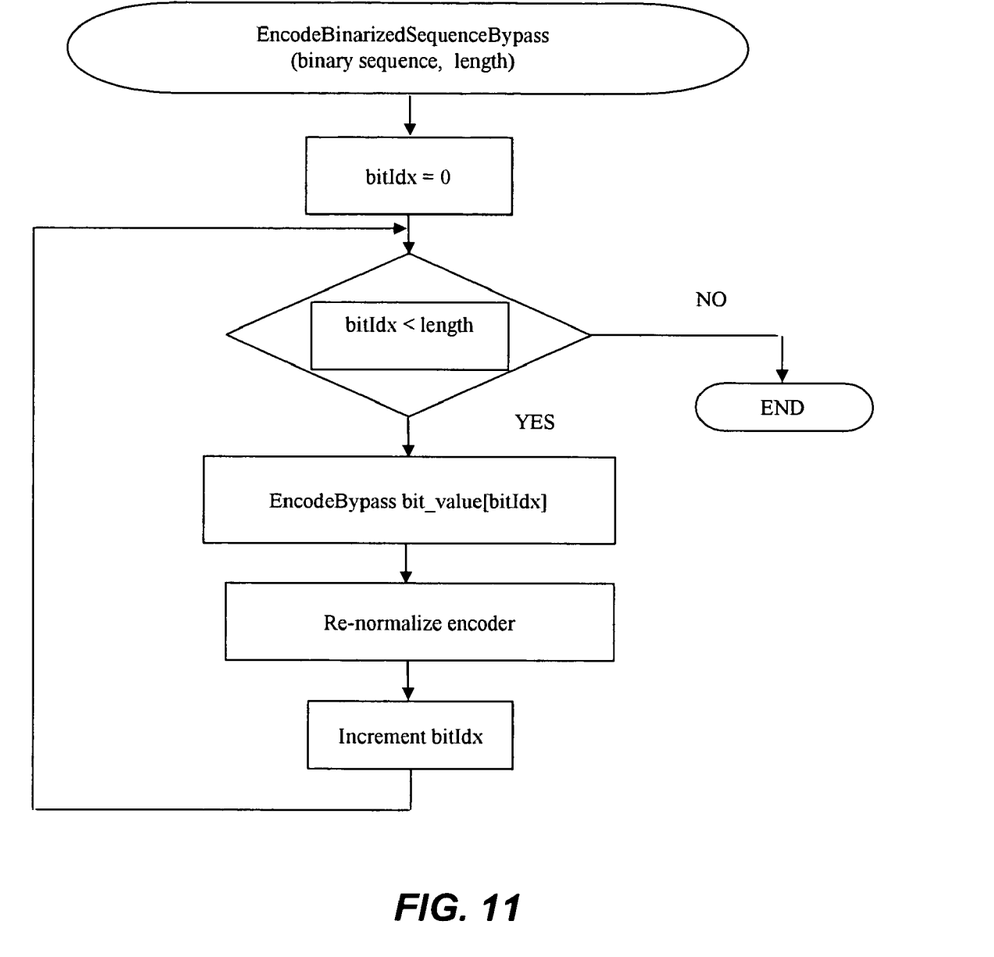
FIG. 11 is a flow chart depicting the multiple-bit CABAC bypass mode encoding engine according to one embodiment of the present invention.

Once a residual data or motion vector data syntax element is binarized, the suffix of the binary string can be presented to the multiple-bit CABAC bypass encoding engine as shown in FIG. 11, on the same pattern as in the regular encoding mode of the present invention.

FIG. 11 is a flow chart depicting the multiple-bit CABAC bypass encoding engine according to one embodiment of the present invention. The inputs to this routine include a binarized sequence and its length. By comparing the CABAC bypass encoding engine as shown in FIG. 11 with the prior art process of FIG. 8, procedure call overhead is significantly reduced by the present invention.

Figure 12:
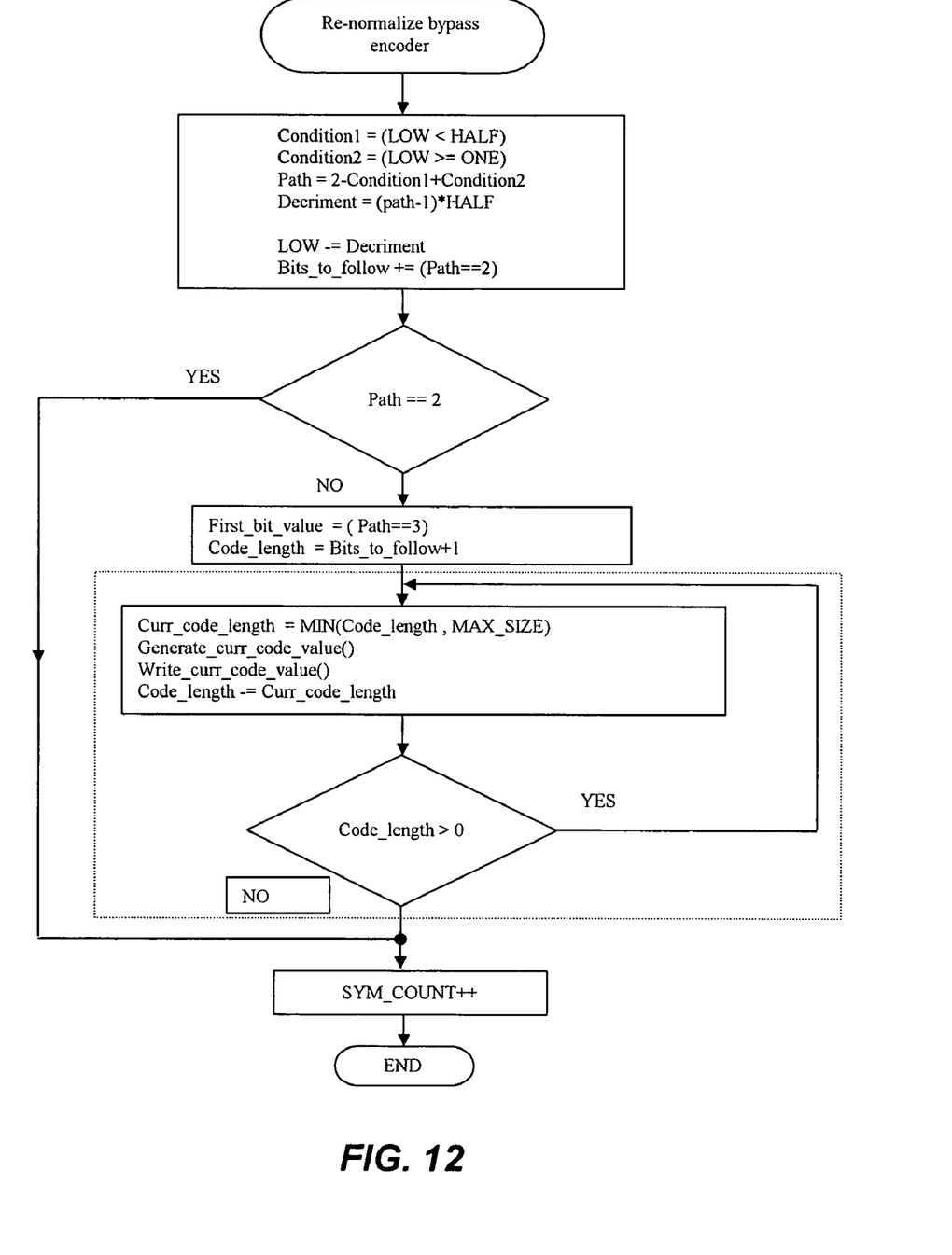
FIG. 12 is a flow diagram showing the re-normalization part of the CABAC bypass mode encoding engine according to one embodiment of the present invention.

FIG. 12 is a flow diagram showing the re-normalization part of the CABAC bypass mode encoding engine according to one embodiment of the present invention. The bypass mode encoding engine of FIG. 12 bears resemblance to the regular mode encoding engine as shown in FIG. 7. As in the case of regular mode encoding, the bypass encoding engine reduces the amount of branching in the code and exposes the hidden inherent parallelism in the CABAC bypass encoding process. The overall processing is again divided into two parts, the encoding part and the bit-writing part. By creating two separate processing parts, instruction level parallelism is increased, thereby improving the performance of the processing devices. For example, VLIW processors can benefit from the encoding format of FIG. 12, since compilers will have ample opportunity to optimize and schedule the code and reduce the number of decision trees.

Similar to the regular encoding mode as shown in FIG. 7, one important feature of the CABAC bypass encoding format is the simultaneous multiple-bit writing process, shown enclosed in the dotted block in FIG. 12. Since the number of bits that are available for writing at a certain time instance is known and the binary value of the first bit and those of the following bits are also known, the entire code sequence that is to be written may be generated in advance.

A simultaneous multiple-bit writing process is then executed to write the entire code sequence in one step. If the length of the code word to be written is greater than the maximum code size (MAX_SIZE) that can be written simultaneously, the code sequence is broken down into chunks of MAX_SIZE and the entire sequence is written in minimum iterations. The value of MAX_SIZE may vary from one implementation to another and may depend upon the underlying architecture of the computing device.

Similarly, it should be noted that the present invention simultaneously generates and writes multiple code bits without requiring any intermediate storage stage.

In other embodiments, the CABAC regular mode and CABAC bypass mode encoding engines of the present invention can be combined together to form a single process. This and other similar modifications fall within the scope of the present invention. It may also be noted that there can be many ways of implementing the CABAC encoding procedures.

Although the present invention has been discussed from the perspective of a software implementation on DSPs and other processors, a dedicated hardware solution can also be developed based upon the above description and would fall within the scope of the present invention.

The various illustrative logical blocks, modules, circuits, elements, and/or components described in connection with the embodiments disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration.

The methods described in connection with the embodiments disclosed herein may be embodied directly in hardware, in a software module executable by a processor, or in a combination of both, in the form of control logic, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit of scope of the invention. Thus, the present invention is not intended to be limited to the embodiments shown herein, but is to be accorded the full scope consistent with the claims, wherein reference to an element in the singular is not intended to mean "one and only one" unless specifically so stated, but rather "one or more". All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for".

What is claimed is:

1. A method for providing context-based adaptive binary arithmetic CABAC coding, the method comprising:
   performing binarization on one or more syntax elements to obtain a binary sequence;
   providing data bits of the said binary sequence to an arithmetic encoding unit in bulk;
   performing binarization on one or more syntax elements to generate exp Golomb code by converting mapped syntax-element values to corresponding floating point type values;
   performing re-normalization of CABAC encoding by restructuring the re-normalization into two processing units including an arithmetic encoding unit and a bit writing unit; and
   configuring the bit writing unit to format signal bits into a multiple-bit sequence, and write multiple bits simultaneously during an execution of a bit writing loop.

2. The method of claim 1 wherein:
   a single syntax element or a plurality of syntax elements are binarized to obtain a binary sequence;
   context data is generated for the bits of the said binary sequence; and
   the bits of the said binary sequence and the corresponding context data are provided to the arithmetic encoding unit in bulk or in chunks of suitable sizes.

3. The method of claim 1 wherein the binarization on order-0 and order-3 exp Golomb code suffixes is carried out by converting mapped syntax-element values to corresponding floating point type numbers in single or double precision arithmetic and using an exponent of the floating point type numbers to determine the length and code value of the binary sequence.

4. The method of claim 1 wherein the bit writing unit is separated from the arithmetic encoding unit to increase parallelism and reduce branching in CABAC regular mode renormalization process.

5. The method of claim 4 wherein the bit writing unit of the re-normalization process in CABAC regular encoding mode is configured to format the first bit and the following bits into a multiple bit sequence and write multiple bits simultaneously during one execution of a bit writing loop.

6. The method of claim 4 wherein the bit writing unit of the re-normalization process in CABAC regular encoding mode is configured to format the first bit and the following bits into a multiple bit sequence, divide the bit sequence into chunks of suitable sizes, and write multiple bits simultaneously during each iteration of a bit writing loop.

7. The method of claim 4 wherein the bit writing unit of the re-normalization process in CABAC regular encoding mode is configured to write multiple bits simultaneously during each iteration of a bit writing loop without requiring any intermediate storage.

8. The method of claim 1 wherein a multiple-bit CABAC bypass or regular mode encoding routine performs arithmetic encoding on all the bits of a binary sequence and generates output for the entire binary sequence.

9. The method of claim 1 wherein the bit writing unit is separated from the arithmetic encoding unit to increase parallelism and reduce branching in CABAC bypass encoding mode.

10. The method of claim 9 wherein the bit writing unit of the re-normalization process in CABAC bypass encoding mode is configured to format the first bit and the following bits into a multiple bit sequence and write multiple bits simultaneously during one execution of a bit writing loop.

11. The method of claim 9 where the bit writing unit of the re-normalization process in CABAC bypass encoding mode is configured to format the first bit and the following bits into a multiple bit sequence, divide the bit sequence into chunks of suitable sizes, and write multiple bits simultaneously during each iteration of a bit writing loop.

12. The method of claim 9 wherein the bit writing unit of the re-normalization process in CABAC bypass encoding mode is configured to write multiple bits simultaneously during each iteration of a bit writing loop without requiring any intermediate storage.

13. A digital signal processor configured to execute the method as recited in claim 1.

14. The method of claim 13 wherein the digital signal processor is a very long instruction word (VLIW) processor.

15. A video encoder configured to execute the method as recited in claim 1.

16. The method of claim 1, wherein the binarization of data elements to order-k exp Golomb code suffices is carried out by converting mapped data-element values to corresponding floating point type numbers in single or double precision arithmetic and using an exponent of the floating point type numbers to determine the length and code value of the binary sequence.

* * * * *